United States Patent [19]
Cavezzan et al.

[11] Patent Number: 4,939,065
[45] Date of Patent: Jul. 3, 1990

[54] UV-CURABLE ORGANOPOLYSILOXANE COMPOSITIONS AND NEGATIVE PHOTORESISTS COMPRISED THEREOF

[75] Inventors: Jacques Cavezzan, Villeurbanne; Sylvianne Dumas; Louis Giral, both of Montpellier; Christian Prud'Homme, Lyons; Francois Schué, Strasbourg-Robertsau, all of France

[73] Assignees: Ciba-Geigy Corporation, Ardsley, N.Y.

[21] Appl. No.: 217,498

[22] Filed: Jul. 11, 1988

Related U.S. Application Data

[63] Continuation-in-part of Ser. No. 37,991, Apr. 14, 1987, abandoned.

[30] Foreign Application Priority Data

Apr. 14, 1986 [FR] France ................. 86/05483

[51] Int. Cl.$^5$ ................. G03C 1/52; G03C 1/94; G03C 1/76
[52] U.S. Cl. ................. 430/167; 430/154; 430/155; 430/287; 430/272; 430/278; 430/271; 430/917; 430/913; 522/28; 522/29; 522/99; 522/62
[58] Field of Search ............... 430/154, 155, 287, 272, 430/278, 271, 917, 913, 167; 522/28, 29, 99, 62

[56] References Cited

U.S. PATENT DOCUMENTS

| | | | |
|---|---|---|---|
| 3,782,940 | 1/1974 | Ohto et al. | 96/36 |
| 4,510,094 | 4/1985 | Drahnak | 522/99 X |
| 4,530,879 | 7/1985 | Drahnak | 428/352 |
| 4,603,168 | 7/1986 | Sasaki et al. | 522/22 |
| 4,640,939 | 2/1987 | Cavezzan | 522/99 |

FOREIGN PATENT DOCUMENTS

| | | | |
|---|---|---|---|
| 0110777 | 10/1974 | Japan | 522/62 |
| 2101150 | 1/1983 | United Kingdom . | |

Primary Examiner—Paul R. Michl
Assistant Examiner—Cynthia Hamilton
Attorney, Agent, or Firm—Harry Falber; Stevens, Davis, Miller & Mosher

[57] ABSTRACT

Substrates, e.g., silicon wafers, coated with a UV-curable organopolysiloxane composition including a crosslinking catalyst therefor (e.g., a platinum group metal compound) and an amount of a crosslinking inhibitor (e.g., an azodicarboxylate) which is effective at ambient temperature, but ineffective to prevent crosslinking on exposure of the composition to ultraviolet radiation, are well adapted for the imaging of negative intelligence patterns thereon.

10 Claims, No Drawings

UV-CURABLE ORGANOPOLYSILOXANE COMPOSITIONS AND NEGATIVE PHOTORESISTS COMPRISED THEREOF

BACKGROUND OF THE INVENTION

1. Field of the Invention:

The present invention relates to a UV-crosslinkable organopolysiloxane composition and to the use thereof as a negative resist especially adapted for microlithography applications.

2. Description of the Prior Art:

Significant progress has been made in recent years, both in the size reduction and in the cost reduction of electronic components, by virtue of the advances made in the technology of production of microelectronic circuits, for example, in the field of microlithography.

In general, the microlithography process includes:

(a) the application of "a resist", a film of radiation-sensitive polymeric material to one of the face surfaces of the substrate, (b) the exposure of certain areas of the film to ultraviolet light, an electron beam, X-rays, and the like, for example, and (c) development of the film with a solvent to remove the soluble portions thereof.

Insofar as the polymeric materials, the "resists", are concerned, these are commonly divided into two categories, according to their behavior when subjected to irradiation.

Some resins are characterized by an increased solubility after irradiation and produce a hollow image: these resins are referred to as positive. The others become insoluble in a solvent for post-irradiation development and they produce a relief image; these resins are referred to as negative.

In each case, the resist portion which remains on the substrate is employed as a protective coating to permit selective etching or any other treatment of the uncoated areas of the substrate.

Substrate etching may be performed by conventional chemical attack or by a plasma. Plasma etching generally makes it possible to obtain finer resolution than that obtained by chemical attack, and, in addition, makes it possible to eliminate contamination and handling problems which are inherent in chemical agents. However, many resins cannot withstand plasma discharge and are themselves eroded along with the substrate, and this unavoidably gives rise to a loss in image resolution.

In parallel with these approaches, it will be appreciated that the growing complexity and miniaturization of integrated circuits expose the limitations of the technologies which rely on only one resist layer or level. Thus, in various earlier investigations reported, for example, in *Solid State Technology*, pages 130–135 (Aug., 1985), it has been proposed to solve, at least partially, the problems presented by the topography and the reflection of a substrate such as a silicon wafer, by using a plurality of resist layers or levels.

Thus, it has been proposed to deposit a first, relatively thick layer of a polymeric material, referred to as a flattening layer, and to coat this first thickness with a thin radiation-sensitive, plasma-resistant layer of a silicon-containing polymer.

There exists, therefore, serious need in this art for polymeric materials having enhanced radiation sensitivity for producing repeat patterns with higher resolution, in response to the demand for increasingly sophisticated circuitry.

Understandably, this research is carried out in parallel with the emergence of the newer technologies.

As will be seen later, the present invention relates more particularly to the field of negative resists, that is to say, those polymeric compositions or materials which are rendered or become insoluble in a development solvent after exposure to light, especially to ultraviolet (UV) radiation.

There already exist in this art known systems in which an initiator of chemical reactions, reactions which involve either the principal chain or the side groups of a polymer and which produce a profound change in the solubility and/or in the plasma-etching resistance of this polymer, is activated under the influence of UV-radiation.

Thus, U.S. Pat. No. 3,984,253 describes the sensitization of a polyphthalaldehyde to UV-radiation, to an electron beam, or to X-rays, by the introduction of acid-generating compounds such as diazonium salts in order to produce a positive image.

There is another known system (cf. U.S. Pat. No. 4,491,628) in which an acid is generated by irradiation, and the acid generated in such manner is used to cleave labile pendent acid groups on the side chains of a polymer. The irradiated portions differ from the unexposed portions in their polarity and their solubility; they can, therefore, be selectively removed using alkaline development treatments or polar solvents. The unexposed portions may be selectively removed using a nonpolar solvent. However, most of the compositions which can be used for this purpose form, after development, solid layers which do not withstand plasma. Furthermore, the choice of the solvents employed for development is very critical.

It is also known to this art that the polysiloxanes are among the foremost polymers envisaged for the preparation of two-layer resists. However, these dimethylsiloxane, methylphenylsiloxane and/or methylvinylsiloxane copolymers are sensitive to near UV-radiation only insofar as care has been taken to incorporate sensitive groups into their structure, for example, acrylic or methacrylic groups. Furthermore, incorporation of such functional groups in the polymer structure is difficult to carry out.

It has also been proposed (cf. JA 60/057,833) to use, as a resist capable of withstanding an oxygen plasma, polysiloxanes having what is known as a "ladder" structure of the formula:

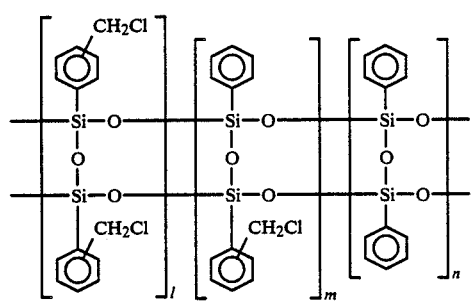

in which l, m and n are positive integers which may be zero, provided, however, that l and m are not zero simultaneously.

Notwithstanding the fact that these polymers are relatively difficult to synthesize, they also constitute part of a system in which a direct photosensitization, involving substantially pure photochemistry, occurs, that is to say, each photon activates a pendent chemical moiety on the principal chain of the polymer, and this implies that the degree of crosslinking or chain scission which is detected, depending on each particular case, is directly proportional to the amount of light energy which is applied.

SUMMARY OF THE INVENTION

Contrariwise, in the system according to the present invention, photosensitization is carried out in an "indirect" manner, namely, a photon initiates catalytic activity. Crosslinking then occurs using quantities of applied energy which are much lower vis-a-vis the known systems. In view of such chemical amplification, the compositions according to this invention are highly sensitive to UV and permit an increase in production rates. In addition, the utilization of organosilicon compounds imparts resistance to plasma etching.

From another standpoint, the system/composition according to the present invention entails a reaction which is, per se, well known to this art, namely, the hydrosilylation reaction of polymeric or other materials comprising Si-alkenyl groups, a reaction which is selective, fast and of high yield, and which has never been employed for this purpose, insofar as applicants are aware. Hydrosilylation involves the reaction of an organosilicon compound containing at least one silicon atom bonded to a hydrogen atom with a compound containing at least one silicon atom bonded to a carbon atom of a group containing alkenyl unsaturation, without the formation of any coproduct.

Briefly, the present invention features, as a negative resist, a film-forming organopolysiloxane composition capable of being crosslinked by hydrosilylation in the presence of a catalyst derived from a platinum group metal, the activity of the catalyst being reversibly blocked by an inhibitor. The catalytic activity is produced essentially by exposing the subject composition to ultraviolet light. The composition according to this invention thus comprises:

(1) at least one organopolysiloxane containing, per molecule, at least x hydrocarbon groups containing alkenyl unsaturation and bonded to a silicon atom, with x being greater than or equal to two;

(2) at least one organohydropolysiloxane containing, per molecule, at least y hydrogen atoms bonded to a silicon atom, with y being greater than or equal to two, and with (x+y) being less than five, with the proviso that the Si-H and Si-alkenyl groups may be borne by the same molecule;

(3) a catalytically effective amount of a platinum group metal compound;

(4) an amount of at least one azodicarboxylate which is effective in inhibiting the formation of a gel at ambient temperature, but in insufficient amount to prevent crosslinking on exposure to ultraviolet rays; and (5) an organic solvent, if appropriate.

The present invention also features a substrate comprising at least one face surface coated with a uniform adherent film, having a thickness of from about 0.1 to 3 micrometers, formed from the above composition, and to the imaging of such substrate with a pattern of intelligence.

It is also to be noted that related compositions wherein the x+y value is equal to or greater than 5 are disclosed in U.S. Pat. No. 4,640,939. Such systems with these higher values are indicated for their anti-stick characteristics. However, in contrast to the systems of the instant invention, these prior art systems with the presence of this feature along with certain solubility limitations and limitations in certain other desired photoresist properties stemming from the lengthened siloxane chains are not readily applicable for such photoresist utility.

DETAIL DESCRIPTION OF THE PREFERRED EMBODIMENTS OF THE INVENTION

More particularly according to the present invention, the first component of the subject composition is advantageously an organopolysiloxane containing, per molecule, at least x hydrocarbon groups containing alkenyl unsaturation and bonded to a silicon atom, with x being greater than or equal to two. This component may be "substantially linear", that is to say, it may be a polymer or a copolymer containing a straight or partly branched chain. The groups containing alkenyl, preferably vinyl, unsaturation, may be located at the end of the polymer chain and/or within the chain itself. This first component advantageously has a viscosity of from approximately 50 to 100,000 mPa.s at 25° C. It may be a diorganopolysiloxane containing from 1.9 to 2.1 organic radicals per silicon atom. The organic radicals (other than the radicals containing alkenyl unsaturation) may be of any type, to the extent that these radicals are devoid of aliphatic unsaturation and have no detrimental influence on the catalytic activity of the constituent (3) of the composition. Exemplary of such radicals, representative are methyl, ethyl, phenyl and 3,3,3-trifluoropropyl radicals. These compounds are well known and are described, in particular, in U.S. Pat. Nos. 3,220,972, 3,344,111 and 3,434,366.

Up to 80% by weight of this polymer may be replaced by a resinous product which is an organopolysiloxane copolymer essentially consisting of trimethylsiloxane, methylvinylsiloxane and $SiO_2$ recurring units, in which from 2.5 to 10 mol % of the silicon atoms bear a vinyl group and in which the molar ratio of trimethylsiloxane groups to $SiO_2$ groups ranges from 0.5 to 1. Such resinous copolymers which are useful according to the present invention are described in U.S. Pat. Nos. 3,284,406 and 3,436,366.

The composition may also contain a cycloorganosiloxane compound containing vinyl and methyl groups in the form of a tetramer, such as 1,3,5,7-tetramethyl-1,3-5,7-tetravinylcyclotetrasiloxane.

Component (2) is an organohydropolysiloxane containing, per molecule, at least y hydrogen atoms bonded to a silicon atom, y being greater than or equal to two. This component, which may be linear or cyclic, advantageously has a viscosity of from 10 to 100,000 mPa.s at 25° C.

The amount by weight of hydrogen atoms bonded to silicon does not exceed 1.67 and preferably ranges from 0.1 to 1.6% in the case of polymers containing only SiH and Si-CH$_3$ groups.

The valencies of the silicon which are not satisfied by hydrogen atoms and oxygen atoms are preferably satisfied by methyl, ethyl and/or phenyl groups.

The SiH groups may be located within the polymer chain or at the ends thereof, or within as well as at the chain ends of the organohydropolysiloxanes.

Representative are, for example, the polymethylhydrosiloxanes having trimethylsiloxyl end groups, polydimethylpolymethylhydrosiloxane copolymers having trimethylsiloxyl end groups, and polydimethylpolymethylhydrosiloxane copolymers having hydrodimethylsiloxyl end groups.

The compounds (2) are per se well known to this art and are described, for example, in U.S. Pat. Nos. 3,220,972, 3,341,111, 3,436,366 and 3,697,473.

Up to 80% by weight of this polymer may be replaced by a resinous product which is an organopolysiloxane bearing mono-, di- or trifunctional siloxane recurring units, some of which bearing SiH groups; examples of such recurring units correspond to the following formulae:

RHSiO, $HSiO_{1.5}$, $HSiO_{0.5}$, in which R denotes a methyl, ethyl, n-propyl, phenyl or 3,3,3-trifluoropropyl radical.

Hydrogenated resins, such as those described, in particular, in U.S. Pat. Nos. 3,284,406 and 3,486,366, may be employed for this purpose.

The composition of this invention may also contain a cycloorganosiloxane compound bearing methyl groups and hydrogen atoms on silicon atoms in the form of a tetramer, such as 1,3,5,7-tetramethyl-1,3,5,7-tetrahydrocyclotetrasiloxane.

In general, the total amount of resin may constitute up to 80% by weight of the solids content of the composition, provided, however, that it remains soluble in the organic solvents.

As indicated above, the SiH and Si-vinyl groups may be borne by a copolymer constituting a single polysiloxane.

The sum of the number of groups containing (alkenyl, preferably vinyl) unsaturation per molecule of compound (1) and of the number of SiH groups per molecule of compound (2) should be less than 5 such as to produce a crosslinked polymer during the crosslinking of the organopolysiloxane composition.

The ratio of the number of SiH groups to vinyl groups is generally greater than 0.4 and generally less than 2 and preferably ranges from 0.7 to 1.4.

As the catalyst (3), complexes of a platinum group metal are advantageously used, particularly the platinum-olefin complexes described in U.S. Pat. Nos. 3,159,601 and 3,159,662, the reaction products of platinum compounds with alcohols, aldehydes and ethers, described in U.S. Pat. No. 3,220,972, the platinum-vinylsiloxane catalysts described in French Patent No. 1,313,846 and the patent of addition thereto, No. 88,676, and French Patent No. 1,480,409, as well as the complexes described in U.S. Pat. Nos. 3,715,334, 3,775,452 and 3,814,730, or a rhodium catalyst such as described in U.S. Pat. Nos. 3,296,291 and 3,928,629.

The preferred platinum group metals are platinum and rhodium; although less active, ruthenium, being less expensive, can also be used.

Particularly interesting results are obtained using platinum-vinylsiloxane complexes, especially the 1,3-divinyl-1,1,3,3-tetramethyldisiloxane complex and platinum-methylvinylcyclotetrasiloxane complexes, in particular the 1,3,5,7-tetramethyl-1,3,5,7-tetravinylcyclotetrasiloxane platinum complex.

The azodicarboxylates used as the inhibitors (4) in the composition of the invention are characterized in that they contain the group:

with each carboxyl group being bonded to an organic radical without detrimental effect on the catalytic activity of the compound (3), and in that they are liquid at 25° C. or, if they are solid at this temperature, in that they are soluble in an organic solvent which is compatible with the organopolysiloxane compositions.

These inhibitors (4) preferably have one or the other of the formulae (I) and (II) below:

$$R_1OOC-N=N-COOR_2 \quad (I)$$

in which $R_1$ and $R_2$, which are identical or different, denote a linear or branched chain alkyl radical containing from 1 to 12 carbon atoms, preferably from 1 to 4 carbon atoms.

The compounds having the formula (I) are, for the most part, known compounds, the preparation of which is described, in particular, by Ingold and Weaver, *J. Chem. Soc.*, 127, pp. 378–387, wherein the synthesis of ethyl azodicarboxylate is more particularly described.

$$R'_1OOC-N=N-R-OOC-N=N-COOR'_2 \quad (II)$$

in which $R'_1$ and $R'_2$ have the definitions of $R_1$ and $R_2$ and —R— is an alkylene radical of the formula $-(CH_2)_n-$ with n being an integer from 1 to 12, or a radical:

$$-CH_2-CH_2-O-CH_2-CH_2-$$

The synthesis of these compounds is described by Norman Rabjohn, *Journal of the American Chemical Society*, 70, pp. 1181–1183 (Mar., 1948).

Ethyl azodicarboxylate and methyl azodicarboxylate are more especially preferred.

The amount of the complex of catalyst (3) and inhibitor (4) to be added is a function especially of the compositions and of the type of catalyst. As a general rule, the catalyst content ranges from approximately 5 to 1000 ppm, preferably from 10 to 100 ppm (calculated as the weight of precious metal and related to the polysiloxanes).

Very small amounts of inhibitors according to the invention have been found suited to increase the stability of the subject compositions and of a film made from these compositions when stored at typical ambient temperature, that is to say, below approximately 45° C. without, nevertheless, affecting the cure time of a film formed using a composition of this kind and exposed to ultraviolet radiation. Furthermore, it is important to note that a film formed using a composition of this type may be dried at a temperature which may reach 50° C. for 1 hour without its solubility being altered.

The composition according to the invention may also contain a greater or lesser amount of an organic solvent (5) which may represent up to 95% by weight of the composition and, preferably, at most 80%.

A volatile organic solvent can then be used which is compatible with the composition, for example, an alkane, petroleum cuts containing paraffinic compounds, toluene, heptane, xylene, isopropanol methyl isobutyl ketone, tetrahydrofuran, chlorobenzene, chloroform, 1,1,1-trichloroethane, and monoethylene glycol and methylene glycol derivatives.

From 0.1 and 50 parts of the compounds (2) and from 0.005 to 3 parts, preferably from 0.01 to 0.5 parts, by weight of the compound (4) are advantageously used per hundred parts by weight of the compound (1).

The composition according to the invention may also include various additives to improve the properties thereof, especially adhesion.

Without wishing to be bound by any particular scientific theory, the extremely advantageous properties of the inhibitor according to the invention may be explained as follows:

The manner in which the inhibitor (4) according to the invention forms complexes with the catalyst is, in fact, completely different from other known inhibitors. Thus, when a $^{195}$Pt nuclear magnetic resonance (NMR) spectrum is obtained, a catalyst-inhibitor complex (for example, in the case where the inhibitor is methyl maleate, described in French Patent No. 2,456,767) shows a signal characteristic of the formation of a diamagnetic complex.

However, a signal of this type in $^{195}$Pt NMR does not appear when the inhibitor (4) is an azodicarboxylic ester. On the other hand, a signal appears when a paramagnetic electron resonance (PER) spectrum is produced, which demonstrates the formation of a paramagnetic complex of platinum, while this signal does not appear in the case of known inhibitors, in particular methyl maleate.

This paramagnetic complex becomes diamagnetic after UV irradiation, the platinum is activated and the azodicarboxylate is converted into the corresponding hydrazine. The paramagnetic complex is formed in the event of low degrees of oxidation of the platinum, and, more precisely, in the event of oxidation states of 0 and II in the catalytic compound (3) such as described above.

The major advantage of the formation of this paramagnetic complex is that, in contrast to the diamagnetic complex, it is much more stable, especially at elevated temperatures.

As a result, the pot or vat life of the compositions inhibited in this manner, as well as that of the films formed using these compositions under certain conditions, is longer. To destroy the paramagnetic complex and to activate the catalyst, it is necessary to convert the paramagnetic complex into a diamagnetic complex by subjecting a thin layer of the organopolysiloxane composition to UV irradiation.

As those skilled in this art are well aware, organopolysiloxane compositions may have higher or lower viscosities. Some highly viscous or even pasty materials capable, where appropriate, of forming a more or less solid resin will have to be diluted in a solvent to reduce the viscosity to a value which is compatible with the intended end application. Some compositions are fluid even in the absence of a solvent, and these are capable of being stored for several days without an appreciable change in their viscosity.

However, as above-indicated at the beginning of this specification, the present invention also features a substrate comprising at least one face surface coated with a uniform adherent film with a thickness of from about 0.1 to 3 micrometers, formed from a composition of the above type, as well as the imaging of such substrates with a pattern of intelligence.

In the present case, by "substrate" is more particularly intended plaques, wafers and components of plaques or wafers made of materials employed in the manufacture of electronic components or component carriers.

Exemplary of such substrates, representative are wafers (or chips) of silicon coated or otherwise with a layer of oxide or nitride, ceramic plates and aluminum-coated plates; it is also possible to consider as a suitable substrate the same surfaces, coated with a first flattening layer, for example, of a novolak or of any other suitable polymeric material well known to this art.

The process comprises the formation of a film which adheres to the surface using the composition described above, the irradiation of at least a portion of this film with ultraviolet radiation, which will cause the exposed area to cure, while the unirradiated area remains soluble in organic solvents which are compatible with polysiloxane compositions.

Although certain compositions according to the invention have a relatively low viscosity in the absence of solvent (a viscosity or less than 5000 mPa.s, measured at 25° C.), in most cases the organopolysiloxane composition will be diluted in a suitable solvent in order to impart a viscosity thereto which is compatible with the deposition of a thin layer using a rotary plate-coating machine. If necessary, it will be filtered beforehand.

Using predetermined speed of rotation of the plate-coating machine, of the nature of the solvent and of the viscosity of the composition, a thin layer will be deposited onto the substrate such that, after removal of the solvent at a temperature below 50° C. and preferably below 45° C., there remains adhered a thin film having a thickness which generally ranges from about 0.1 to 3 micrometers, and preferably on the order of 1 to 2 micrometers, when a single layer is employed, and on the order of 1000 to 2000 angstroms, if a double or multiple layer is employed.

The formation of the film using the composition of the invention can be effected onto a first layer, known as a flattening layer, such as a novolak (for example); the two layers may also be separated by at least one other layer of another polymeric material.

Regions of the film are then selectively irradiated, for example, using UV radiation, through a mask. In this case, the wavelength ranges from 200 to 400 nanometers and preferably on the order of 254 and 360 nanometers.

After irradiation, the image is developed by dissolving the unirradiated areas of the film by spraying or soaking with an organic solvent, which may be the same as that used to dilute the original composition.

It is then possible to rinse and/or to reheat the areas of the layer which remain on the substrate, if appropriate, and then to carry out an etching process using a chemical agent or a plasma.

In order to further illustrate the present invention and the advantages thereof, the following specific examples are given, it being understood that same are intended only as illustrative and in nowise limitative.

EXAMPLE 1:

A silicone composition consisting of the following mixture was prepared:

(i) 48% by weight of a polysiloxane resin containing approximately 2.8% by weight of vinyl groups bonded to silicon atoms;

(ii) 43.3% by weight of a substantially linear polydimethylsiloxane polymer having dimethylvinylsiloxyl end groups, containing approximately 2.7% by weight of vinyl groups and having a viscosity of approximately 20 mPa.s at 25° C.;

(iii) 2.3% of 1,3,5,7-tetramethyl-1,3,5,7-tetravinylcyclotetrasiloxane; and (iv) 6.4% of a polymethylhydrosiloxane fluid having trimethylsiloxyl end groups, containing approximately 1.5% by weight of hydrogen atoms bonded to silicon and having a viscosity of approximately 20 mPa.s at 25° C.

To this mixture was added 0.04% by weight of ethyl azodicarboxylate (EADC), i.e., 2.3 $10^{-3}$ mole/kg of composition; the EADC diluted in toluene (concentration: 10 g of EADC per liter of solvent) was added dropwise to the vigorously stirred polysiloxane mixture.

Similarly, 50 ppm of platinum (2.5 $10^{-4}$ g-at of platinum per kg of composition) were added in the form of a complex prepared from chloroplatinic acid and 1,3-divinyl-1,1,4,4-tetramethyldisiloxane, as described in U.S. Pat. No. 3,824,730; a toluene solution of this complex was employed (solution concentration: 1 g of platinum per liter of solvent).

The resultant composition was then spread out in a thin layer onto the surface of a water of monocrystalline silicon.

Film deposition was carried out using a rotary plate-coating machine operating at 3000 revolutions/min.

The toluene was then evaporated off by heating for one hour in an oven at 50° C.

A part of the surface of the silicon wafer was protected with a cover which was opaque to UV radiation.

The film was then exposed to UV irradiation for 5 min. This operation was carried out using a Tamarack Scientific Inc. instrument, model PRX 350-4, fitted with a 350W, HBO type mercury lamp.

After development in toluene for 5 to 10 sec, it was found that an adherent polysiloxane film was coated onto the irradiated region, while no trace of silicone material could be detected in the unexposed region.

EXAMPLES 2 AND 3:

The procedure and the starting materials were identical to those described in Example 1.

The concentrations of EADC and of platinum were simply modified, together with the times of exposure to the UV radiation.

EXAMPLE 4:

In this example, an alternative form of the hydrosiolylation catalyst was used, this being the product of the reaction of chloroplatinic acid with octanol, in accordance with the teaching of U.S. Pat. No. 3,220,972.

The remaining constituents of the mixture, and the procedure followed, were identical to those of Examples 1, 2 and 3. The particular conditions, and the results obtained are reported in the Table below:

TABLE

| Example | EADC concentration (% by weight) | Platinum concentration (ppm) | Exposure time (in min) |
|---|---|---|---|
| 1 | 0.04 | 50 | 5 |
| 2 | 0.1 | 77 | 30 |
| 3 | 0.75 | 116 | 10 |
| 4 | 0.1 | 54 | 32 |

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. A substrate bearing on at least one face surface thereof, (a) an essentially uniform adherent film comprised of a stable, UV-curable organopolysiloxane composition comprising
    (1) at least one organopolysiloxane containing, per molecule, at least x alkenyl unsaturated hydrocarbon groups bonded to a silicon atom, wherein x is greater than or equal to 2;
    (2) at least one organohydropolysiloxane containing, per molecule, at least y hydrogen atoms bonded to a silicon atom, wherein y is greater than or equal to 2, and the sum (x+y) is less than 5, with the proviso that the SiH and Si-alkenyl moieties may be borne by the same molecule;
    (3) a catalytically effective amount of a platinum group metal compound; and
    (4) an amount of at least one azodicarboxylate which is effective in inhibiting the formation of gel at ambient temperature, but which is insufficient to prevent crosslinking on exposure of the composition to ultraviolet radiation; and (b) a flattening layer for said at least one face surface positioned between said face surface and said adherent film.

2. The coated substrate as defined by claim 1, wherein said organopolysiloxane composition further comprises (5) an organic solvent therefor.

3. The coated substrate as defined by claim 1, wherein the ratio of the number of SiH groups to alkenyl groups in said organopolysiloxane composition ranges from 0.7 to 1.4.

4. The coated substrate as defined by claim 1, wherein said inhibitor (4) comprises an —OOC—N=N—COO— group, each carboxylate function thereof being bonded to an organic radical which does not adversely affect the catalytic activity of the compound (3), and said inhibitor either being liquid at 25° C. or, if solid at this temperature, being soluble in an organic solvent which is compatible with said organosiloxane composition.

5. The coated substrate as defined by claim 1, wherein said inhibitor (4) has the formula:

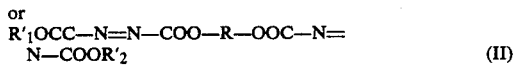

in which $R_1$, $R_2$, $R'_1$ and $R'_2$, which are identical or different, are each a linear or branched chain alkyl radical containing from 1 to 12 carbon atoms, and R is an alkylene radical of the formula —$(CH_2)_n$—, wherein n is an integer of from 1 to 12, or a —$CH_2$—$CH_2$—O—$CH_2$—$CH_2$— radical.

6. The coated substrate as defined by claim 1, wherein said inhibitor (4) is ethyl azodicarboxylate.

7. The coated substrate as defined by claim 1, said adherent film having a thickness of from about 0.1 to 3 micrometers.

8. The coated substrate as defined by claim 1, selected from the group consisting of coated silicon, coated silicon having a surface oxidic or nitridic layer, coated ceramic and coated aluminum.

9. The coated substrate as defined by claim 8, is a coated silicon wafer adapted for the production of an integrated circuit thereon.

10. The coated substrate as defined by claim 9, said silicon wafer having a surface layer of oxide or nitride thereon.

* * * * *